United States Patent [19]

Ikeda

[11] Patent Number: 5,110,749

[45] Date of Patent: May 5, 1992

[54] METHOD FOR MANUFACTURING SEMICONDUCTOR DEVICE

[75] Inventor: Tatsuhiko Ikeda, Itami, Japan

[73] Assignee: Mitsubishi Denki Kabushiki Kaisha, Tokyo, Japan

[21] Appl. No.: 714,723

[22] Filed: Jun. 13, 1991

[30] Foreign Application Priority Data

Jun. 22, 1990 [JP] Japan .................. 2-164604

[51] Int. Cl.⁵ .................. H01L 21/265; H01L 29/70
[52] U.S. Cl. .................. 437/26; 437/31; 437/63; 148/DIG. 10
[58] Field of Search .......... 437/31, 26, 59, 63, 437/64; 148/10, 11

[56] References Cited

U.S. PATENT DOCUMENTS

| | | | |
|---|---|---|---|
| 4,910,160 | 3/1990 | Jennings et al. | 437/31 |
| 4,937,099 | 7/1990 | Seacrist et al. | 437/31 |
| 4,940,671 | 7/1990 | Small et al. | 437/26 |

FOREIGN PATENT DOCUMENTS 63-221660  9/1988  Japan .
1-241164   9/1989  Japan .

Primary Examiner—Olik Chaudhuri
Assistant Examiner—Long Pham
Attorney, Agent, or Firm—Oblon, Spivak, McClelland, Maier & Neustadt

[57] ABSTRACT

A p-type buried layer is formed on the surface of an n-type semiconductor substrate directly or on the surface of an n-type semiconductor region with relatively low impurity concentration which is formed on the surface of the semiconductor substrate. In the case of forming the buried layer directly on the surface of the semiconductor substrate, second conductivity type impurities are injected into the interface of the buried layer and the semiconductor substrate and are diffused, thereby the buried layer being isolated from the semiconductor substrate. Therefore, the impurity concentration and thickness of the buried layer can be sufficiently increased in simple processes.

17 Claims, 19 Drawing Sheets

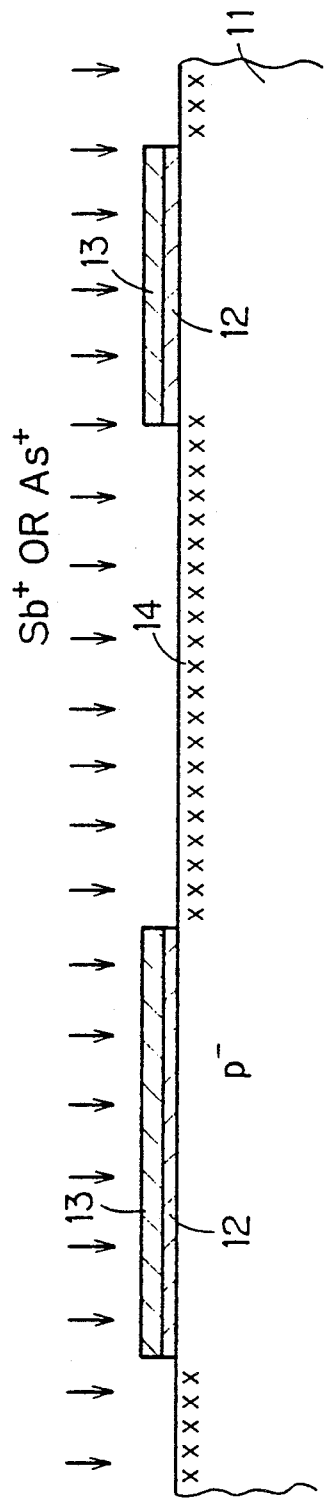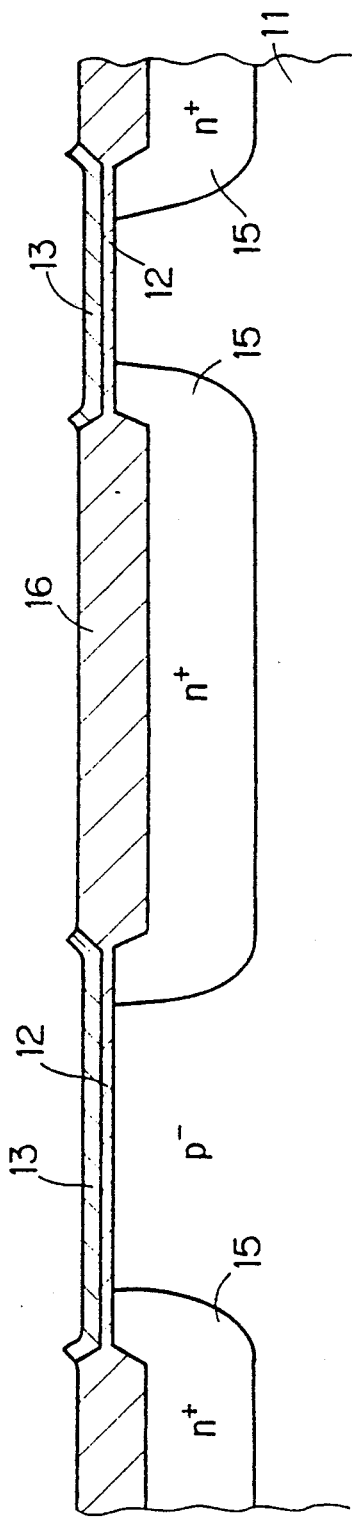

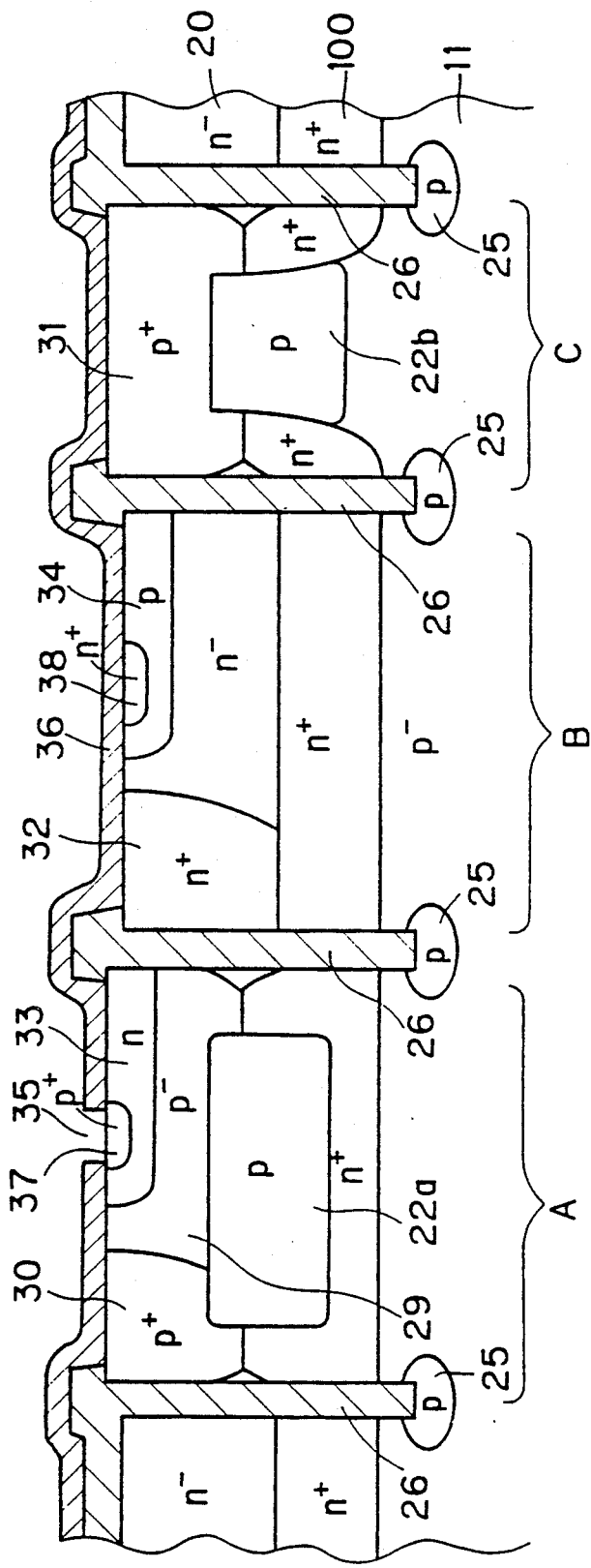

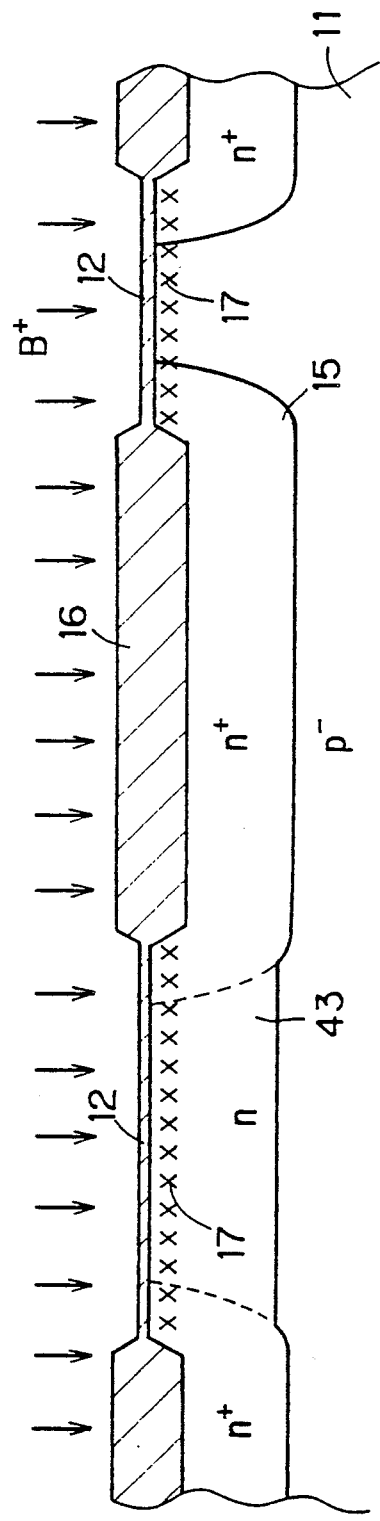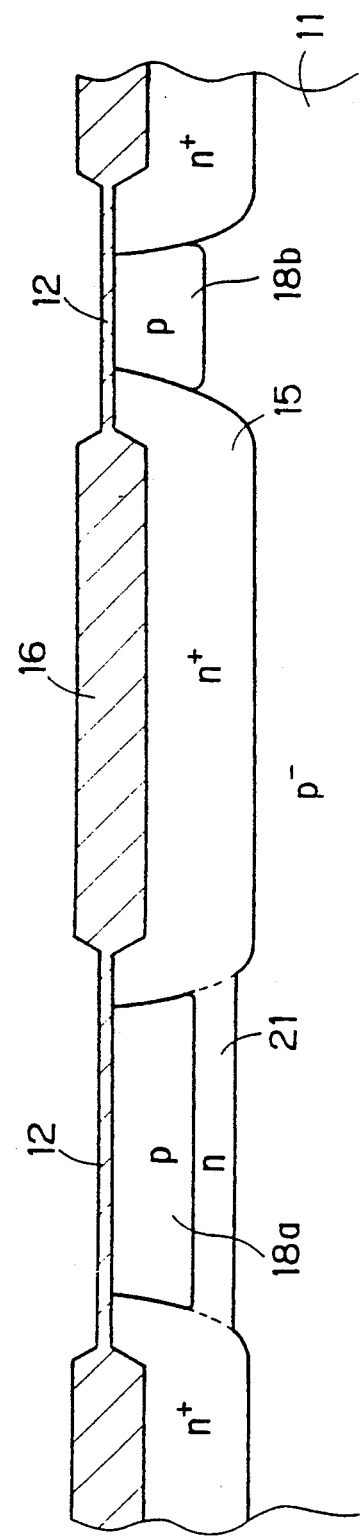

METHOD FOR MANUFACTURING SEMICONDUCTOR DEVICE

BACKGROUND OF THE INVENTION

1. Field of the Invention

This invention relates to a method for manufacturing a semiconductor device and more particularly to a manufacturing method suitable for forming a buried layer in a bipolar npn and pnp transistor mixed type semiconductor device.

2. Description of the Prior Art

FIGS. 5A–5F are cross-sectional views showing a conventional method for manufacturing an npn and pnp transistor mixed type semiconductor device. Referring to FIGS. 5A–5F, the conventional manufacturing method is described hereinafter.

First, as shown in FIG. 5A, into the surface of a $p^-$ type silicon substrate 1 are injected n-type impurities 2 such as antimony ($Sb^+$) and arsenic ($As^+$) at high concentration. The surface of the silicon substrate is oxidized at the same time that the n-type impurities 2 are thermally diffused, thereby an $n^+$ type diffusion layer 3 and a thick oxide film 4 being formed as shown in FIG. 5B.

Next, as shown in FIG. 5C, the oxide film 4 is selectively etched away to form an opening 5. Masked with the oxide film 4, p-type impurities 6 such as boron ($B^+$) are selectively injected into the $n^+$ type diffusion layer 3. After a p-type diffusion layer 7 is formed by the thermal diffusion of the p-type impurities 6 as shown in FIG. 5D, the oxide film 4 is removed.

As shown in FIG. 5E, an $n^-$ type epitaxial layer 8 is grown epitaxially on the $n^+$ type diffusion layer 3. At this time, the p-type impurities in the p-type diffusion layer 7 float up into the $n^-$ type epitaxial layer 8, so that a p-type buried diffusion layer 7a is formed in the interface of the $n^+$ type diffusion layer 3 and the $n^-$ type epitaxial layer 8.

Subsequently, as shown in FIG. 5F, formed are element insulating films 9 which reach the $p^-$ type silicon substrate 1 from the top surface and p-type channel cut regions 10 on the undersurface thereof, thereby first and second element regions A and B being formed. In the $n^-$ type epitaxial layer 8 of the first element region A, a $p^-$ type collector diffusion layer 11, a $p^+$ type collector extraction layer 12, an n-type base diffusion layer 13 and a $p^+$ type emitter diffusion layer 14 are formed, so that a pnp transistor is formed. In the $n^-$ type epitaxial layer 8 of the second element region B, an $n^+$ type collector extraction layer 15, a p-type base diffusion layer 16 and an $n^+$ type emitter diffusion layer 17 are formed, so that an npn transistor is formed. Metal wirings 18 are mounted on the transistors, and thus the semiconductor device is accomplished.

A semiconductor device having the same structure as FIG. 5F is disclosed in IEDM84, pp. 753-756, "NEW SELF-ALIGNED COMPLEMENTARY BIPOLAR TRANSISTORS USING SELECTIVE-OXIDATION MASK" by H. Sadamatsu et al.

The conventional semiconductor device formed through the above-mentioned processes has been disadvantageous in that the thickness of the p-type buried diffusion layer 7a cannot be increased sufficiently.

Generally the $n^+$ type diffusion layer 3 needs the impurity concentration of about $10^{20}$ cm$^{-3}$. In order to form the p-type diffusion layer 7 on the surface of the $n^+$ type diffusion layer 3 having such high concentration, it is necessary to inject the p-type impurities 6 having the concentration higher than the $n^+$ type diffusion layer 3. In particular, for increasing the thickness of the p-type diffusion layer 7, the p-type impurities 6 having the concentration of much more than $10^{20}$ cm$^{-3}$ must be injected. However, if such a large amount of p-type impurities 6 are injected, the crystallinity in the injected region cannot be retrieved. Hence, such injection is practically impossible. For this reason, the p-type diffusion layer 7 to be formed is quite thin, and accordingly the p-type buried diffusion layer 7a formed by the impurities in the p-type diffusion layer 7 which float up into the $n^-$ type epitaxial layer 8 grows at most about 0.3 μm in thickness. As a result, the resistance of the p-type buried diffusion layer 7a becomes high, and the collector resistance of the pnp transistor cannot be reduced sufficiently.

SUMMARY OF THE INVENTION

In the first aspect of the present invention, a method for manufacturing a semiconductor device comprises the steps of preparing a first conductivity type semiconductor substrate with relatively low impurity concentration, forming second conductivity type first and second semiconductor regions with relatively high impurity concentration on a surface of the semiconductor substrate and a first conductivity type third semiconductor region with relatively high impurity concentration on the surface of the semiconductor substrate sandwiched between the first and second semiconductor regions, implanting second conductivity type impurities at a range of reaching an interface of the third semiconductor region and the semiconductor substrate so as to extend over the first and second semiconductor regions, diffusing the impurities to form a second conductivity type fourth semiconductor region connected to the first and second semiconductor regions between the third semiconductor region and the semiconductor substrate, and forming a first conductivity type buried layer by depositing a second conductivity type semiconductor layer with relatively low impurity concentration on an entire top surface to bury the third semiconductor region.

In the second aspect of the present invention, a method for manufacturing a semiconductor device comprises the steps of preparing a first conductivity type semiconductor substrate with relatively low impurity concentration, forming second conductivity type first and second semiconductor regions with relatively high impurity concentration on a surface of the semiconductor substrate, implanting first conductivity type first impurities on the surface of the semiconductor substrate sandwiched between the first and second semiconductor regions and second conductivity type second impurities at a range deeper than the first impurities so as to extend over the first and second semiconductor regions, diffusing the first and second impurities to form a first conductivity type third semiconductor region with relatively high impurity concentration on the surface of the semiconductor substrate sandwiched between the first and second semiconductor regions and a second conductivity type fourth semiconductor region connected to the first and second semiconductor regions between the third semiconductor region and the semiconductor substrate, and forming a first conductivity type buried layer by depositing a second conductivity type semiconductor layer with relatively low impurity concentration on an entire top surface to bury the third semiconductor region.

In the third aspect of the present invention, a method for manufacturing a semiconductor device comprises the steps of preparing a first conductivity type semiconductor substrate with relatively low impurity concentration, forming second conductivity type first and second semiconductor regions with relatively high impurity concentration on a surface of the semiconductor substrate and a second conductivity type third semiconductor region with relatively low impurity concentration on the surface of the semiconductor substrate sandwiched between the first and second semiconductor regions, forming a first conductivity type fourth semiconductor region with relatively high impurity concentration on a surface of the third semiconductor region, and forming a first conductivity type buried layer by depositing a second conductivity type semiconductor layer with relatively low impurity concentration on an entire top surface to bury the fourth semiconductor region.

In the fourth aspect of the present invention, a method for manufacturing a semiconductor device comprises the steps of preparing a first conductivity type semiconductor substrate with relatively low impurity concentration, forming second conductivity type first, second and third semiconductor regions with relatively high impurity concentration on a surface of the semiconductor substrate, a first conductivity type fourth semiconductor region with relatively high impurity concentration on the surface of the semiconductor substrate sandwiched between the first and second semiconductor regions and a first conductivity type fifth semiconductor region with relatively high impurity concentration on the surface of the semiconductor substrate sandwiched between the second and third semiconductor regions, implanting second conductivity type impurities at a range of reaching an interface of the fourth semiconductor region and the semiconductor substrate so as to extend over the first and second semiconductor regions, diffusing the impurities to form a second conductivity type sixth semiconductor region connected to the first and second semiconductor regions between the fourth semiconductor region and the semiconductor substrate, forming first conductivity type first and second buried layers by depositing a second conductivity type semiconductor layer with relatively low impurity concentration on an entire top surface to bury the fourth and fifth semiconductor regions, forming trenches which reach the semiconductor substrate from a surface of the semiconductor layer in boundary portions between the first and fourth semiconductor regions, between the fourth and second semiconductor regions, between the second and fifth semiconductor regions and between the fifth and third semiconductor regions, respectively, and filling up the trenches with insulating material to separate the semiconductor layer into sixth through tenth semiconductor regions corresponding to the first through fifth semiconductor regions, respectively, and forming first and second semiconductor elements in the seventh and ninth semiconductor regions, respectively, a first conductivity type eleventh semiconductor region which reaches the fifth semiconductor region from a surface of the tenth semiconductor region in the tenth semiconductor region, and a substrate potential extraction electrode on the eleventh semiconductor region.

According to the present invention, the first conductivity type buried layer is formed on the surface of the first conductivity type semiconductor substrate directly or on the surface of the second conductivity type semiconductor region with relatively low impurity concentration which is formed on the surface of the semiconductor substrate. In the case of forming the buried layer directly on the surface of the semiconductor substrate, the second conductivity type impurities are injected into the interface of the buried layer and the semiconductor substrate and are diffused, thereby the buried layer being isolated from the semiconductor substrate. Therefore the impurity concentration and thickness of the buried layer can be sufficiently increased in simple processes. When such a buried layer is used for the p-type buried layer of an npn and pnp transistor mixed type semiconductor device, the collector resistance of the pnp transistor can be reduced and the performance thereof can be improved.

Accordingly, it is an object of the present invention to provide a method for manufacturing a semiconductor device capable of forming a sufficiently thick buried layer.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A-1L are cross-sectional views showing one embodiment of a method for manufacturing a semiconductor device according to the present invention;

FIGS. 3A-3D and 4A-4E are cross-sectional views showing further embodiments of the method for manufacturing the semiconductor device according to the present invention.

DESCRIPTION OF THE PREFERRED EMBODIMENTS

Figure 1C:
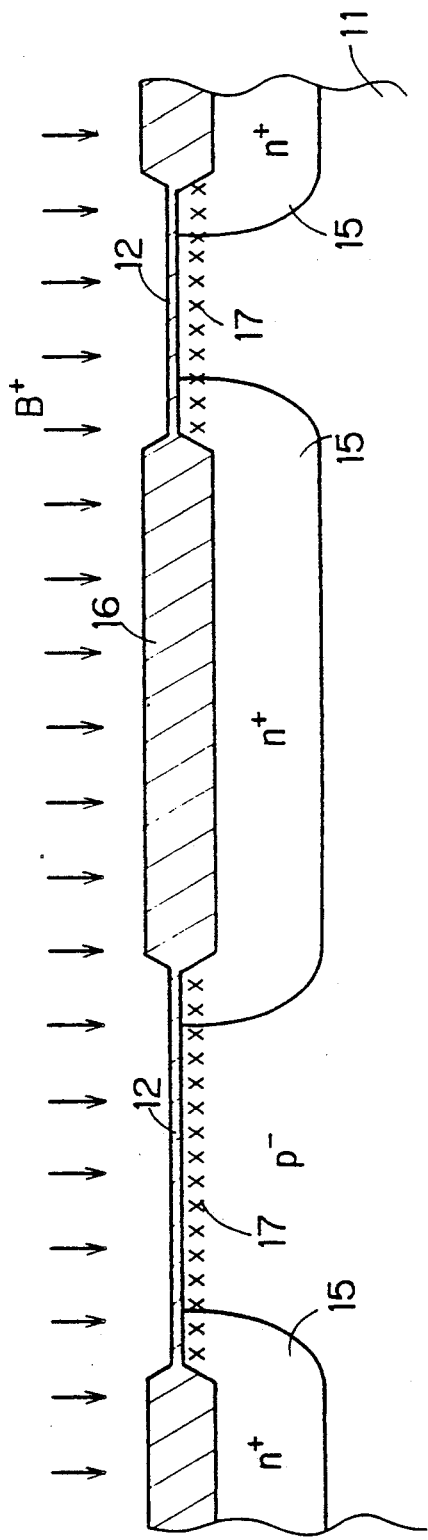

FIGS. 1A-1L are cross-sectional views showing each process of one preferred embodiment which applies a method for manufacturing a semiconductor device according to the present invention to the manufacture of an npn and pnp transistor mixed type semiconductor device. Referring to FIGS. 1A-1L, the method for manufacturing the semiconductor device according to the present invnetion is explained.

First, as shown in FIG. 1A, on a p$^-$ type silicon substrate 11 are formed two-layer structure patterns of a pad oxide film 12 and a nitride film 13. Masked with these films 12 and 13, n-type impurities 14 such as antimony (Sb$^+$) and arsenic (As$^+$) are implanted at high concentration into the p$^-$ type silicon substrate 11.

Next, the implanted n-type impurities 14 are activated and diffused by heat treatment, thereby being formed n$^+$ type diffusion layers 15 and thick thermal oxide films 16 on the surface of the diffusion layers 15 as shown in FIG. 1B. The n$^+$ type diffusion layers 15 may be 2-3 $\mu$m in thickness and about $10^{20}$ cm$^{-3}$ in impurity concentration.

Next, as shown in FIG. 1C, p-type impurities 17 such as boron (B+) are implanted into the silicon substrate 11 after removal of the nitride films 13. At this time, implantation energy is selected so that the p-type impurities 17 do not reach the silicon substrate 11 that is under the thick oxide films 16.

Figure 1D:
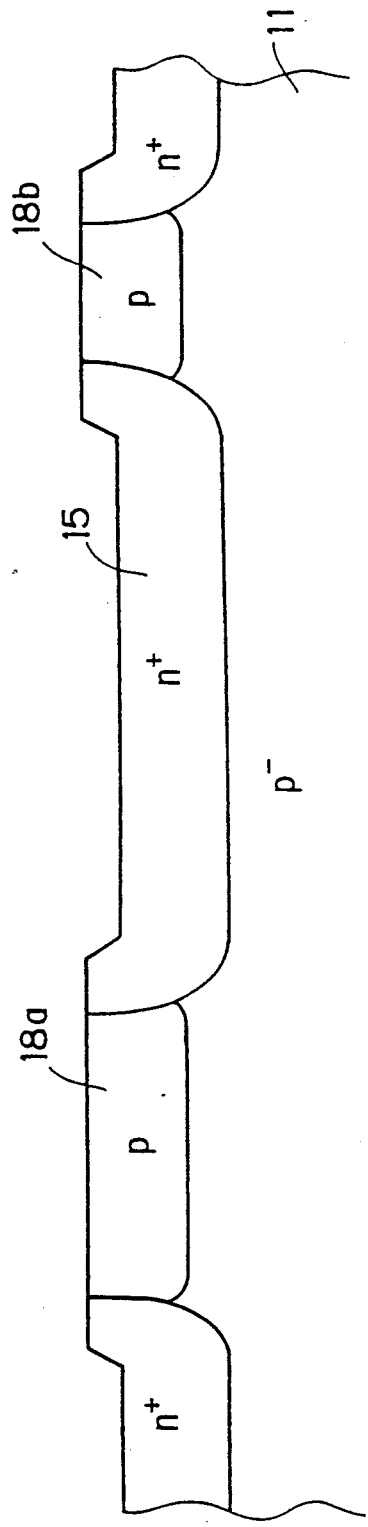

Next, the injected p-type impurities 17 are activated and diffused by heat treatment, thereby being formed p type diffusion layers 18a and 18b as shown in FIG. 1D. The p-type diffusion layers 18a and 18b may be 1–2 μm in thickness and $10^{18}$–$10^{20}$ cm$^{-3}$ in impurity concentration. Thereafter, all the oxide films 12 and 16 formed on the surface of the silicon substrate 11 are removed.

Figure 1E:
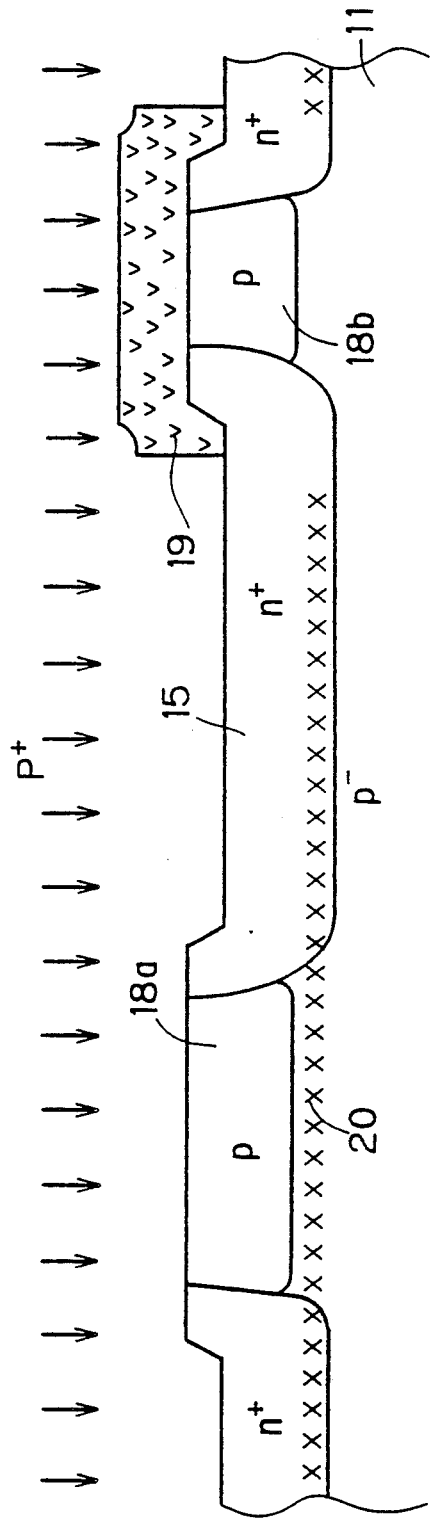

As shown in FIG. 1E, the p-type diffusion layer 18b is coated with thick photoresist 19, and n-type impurities 20 such as phosphorus (P+) are implanted at an energy of about 2 Mev. Hence, the n-type impurities 20 have the peak (or the range) of their concentration distribution in the vicinity of the interface of the p-type diffusion layer 18a and the p$^-$ type silicon substrate 11. The n-type impurities 20 are also present extendedly on the bottoms of the n+ type diffusion layers 15 formed on the both sides of the p-type diffusion layer 18a.

Figure 1F:
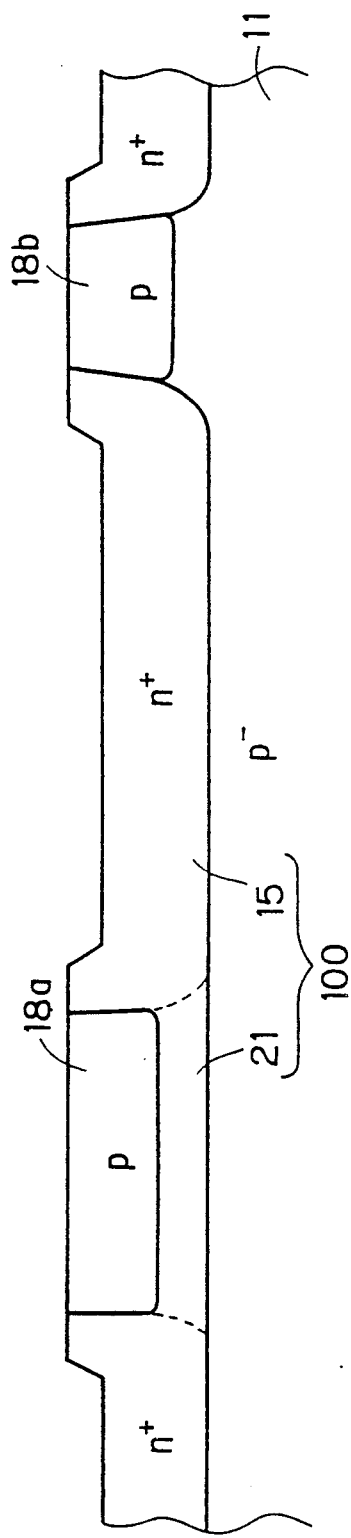

Next, the n-type impurities 20 are activated and diffused by heat treatment, thereby being formed an n+ type (or n-type) diffusion layer 21 immediately under the p-type diffusion layer 18a as shown in FIG. 1F. The diffusion layer 21, united with the n+ type diffusion layers 15 on the both sides thereof, forms an n+ type buried layer 100. The p-type diffusion layer 18a is surrounded by the n+ type buried layer 100 to be isolated from the p$^-$ type silicon substrate 11. At this time, the p-type diffusion layer 18a holds an enough large thickness (1–2 μm) compared with the thickness of the conventional p-type diffusion layer 7 (about 0.3 μm). The diffusion layer 21 may have the high impurity concentration of about $10^{20}$ cm$^{-3}$ which is the same as the diffusion layers 15. Besides, the impurity concentration of the diffusion layer 21 can be set independently of that of the diffusion layers 15. It is advantageous that the pressure resistance between the substrate 11 and the diffusion layer 18a is improved by setting the impurity concentration of the diffusion layer 21 to a relatively low value such as $10^{16}$ cm$^{-3}$. Another advantage is that, because the n-type impurities increase in the deep portion of the n+ type diffusion layers 15, the collector resistance of the npn transistor which is to be formed later can be reduced.

Figure 1G:
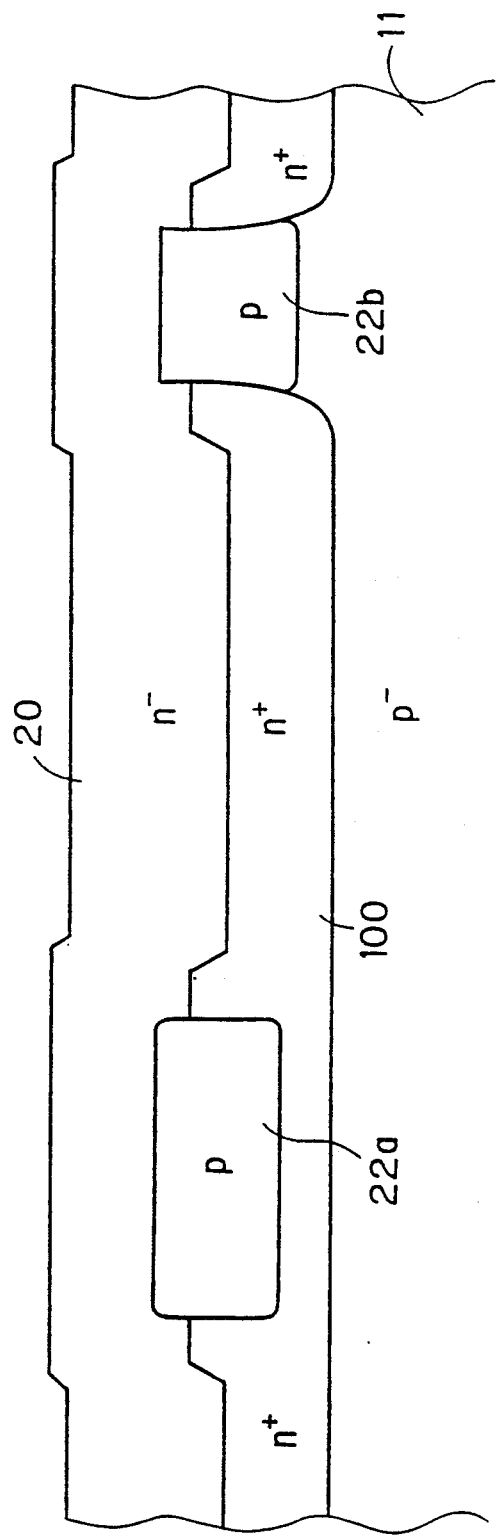

As shown in FIG. 1G, an n$^-$ type epitaxial layer 20 is deposited on the silicon substrate 11 by the epitaxial growth method. The n$^-$ type epitaxial layer 20 may be 1–4 μm in thickness and $5\times10^{15}$–$10^{16}$ cm$^{-3}$ in impurity concentration. At this time, a small amount of impurities in the p-type diffusion layers 18a and 18b float up into the epitaxial layer 20, and the p-type diffusion layers 18a and 18b turn into p-type buried diffusion layers 22a and 22b.

Figure 1H:
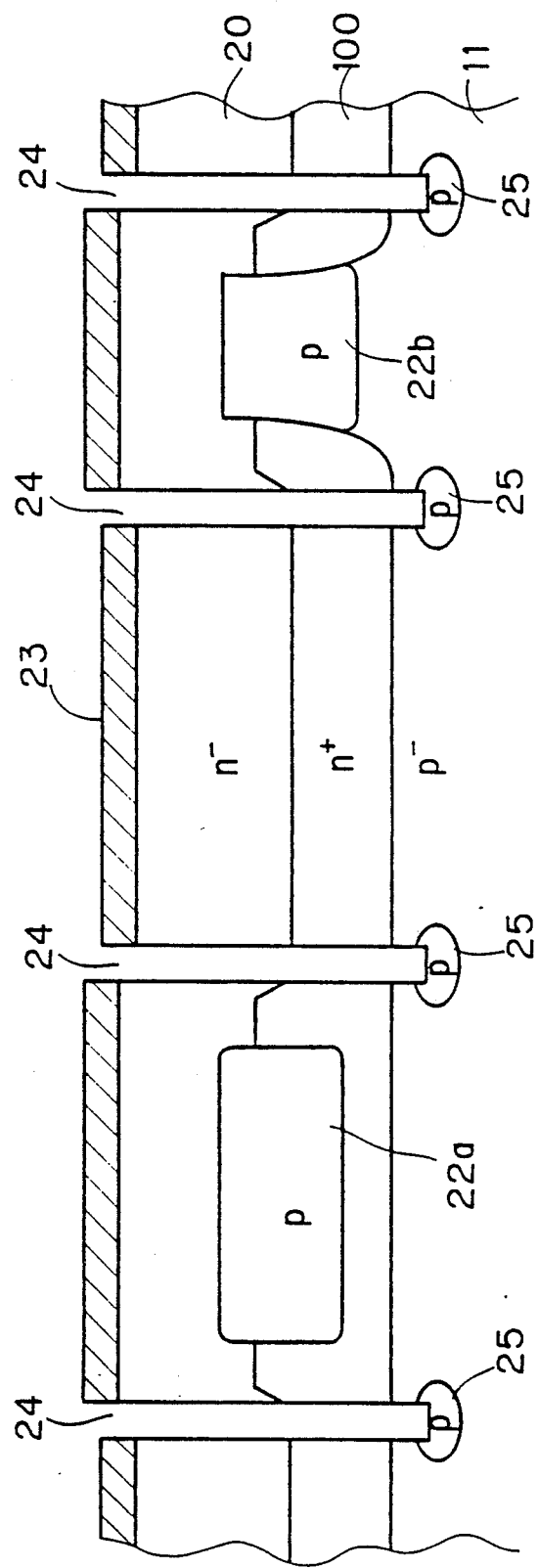

Next, as shown in FIG. 1H, masked with an oxide film pattern 23 formed on the n$^-$ type epitaxial layer 20, reactive ion etching is performed, and trenches 24 which reach the p$^-$ type silicon substrate 11 from the top surface are formed. Likewise masked with the oxide film pattern 23, p-type impurities such as boron (B+) are injected into the bottoms of the trenches 24. The injected p-type impurities are thermally diffused so that a p-type channel cut region 25 is formed.

Figure 1I:
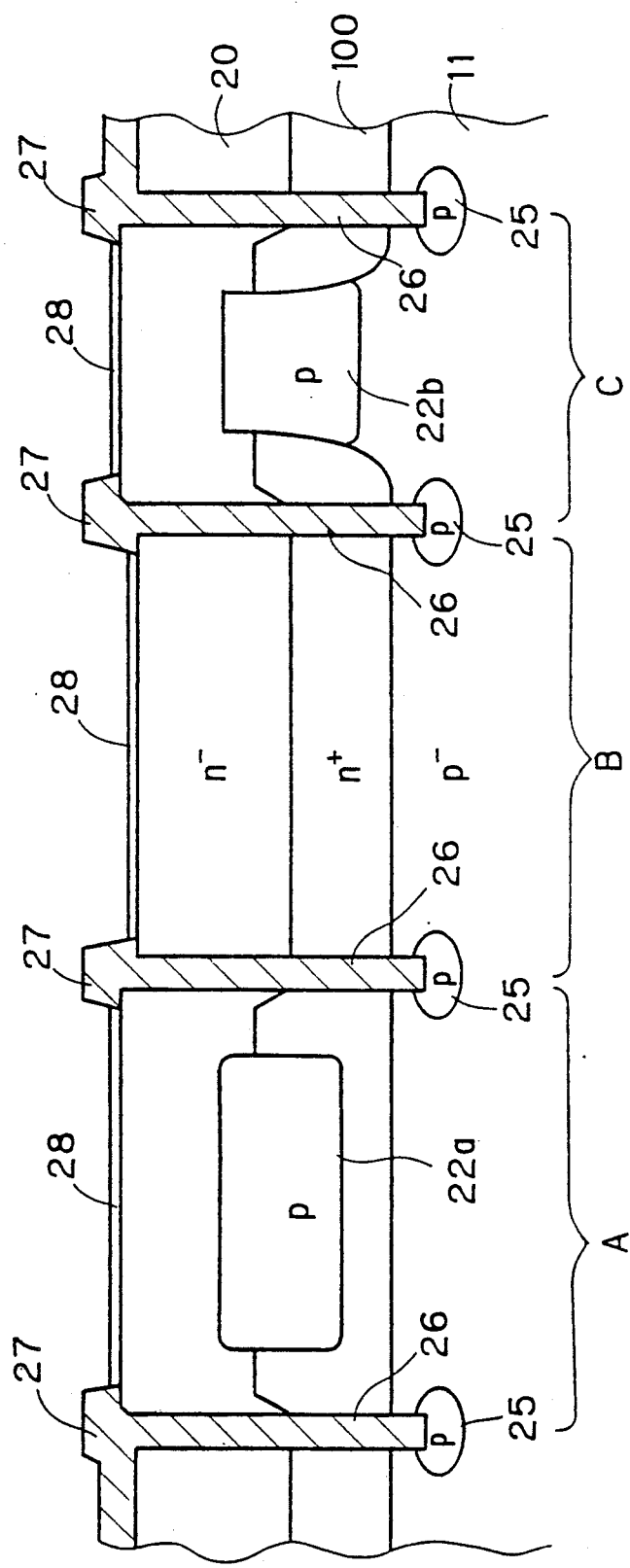

After the oxide film pattern 23 is removed, a silicon oxide film is deposited thickly on the entire top surface. By the etchback of the silicon oxide film, element insulating films 26 are left inside the trenches 24 as shown in FIG. 1I. After forming a field oxide film 27 on the entire surface, element regions A and B and a substrate potential extraction region C are opened by selective etching. Thereafter, thermal oxide films 28 are formed on the surface of the regions A, B and C by thermal oxidation.

Figure 1J:
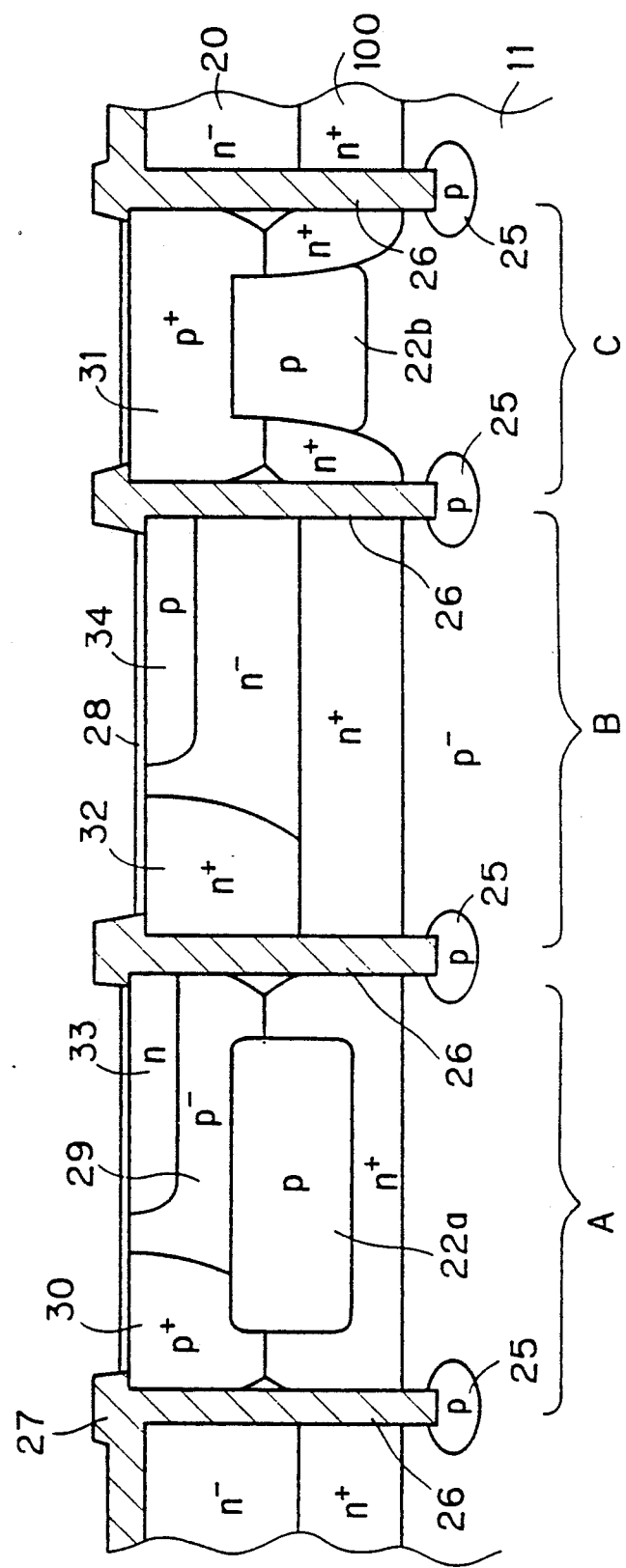
Figure 1L:
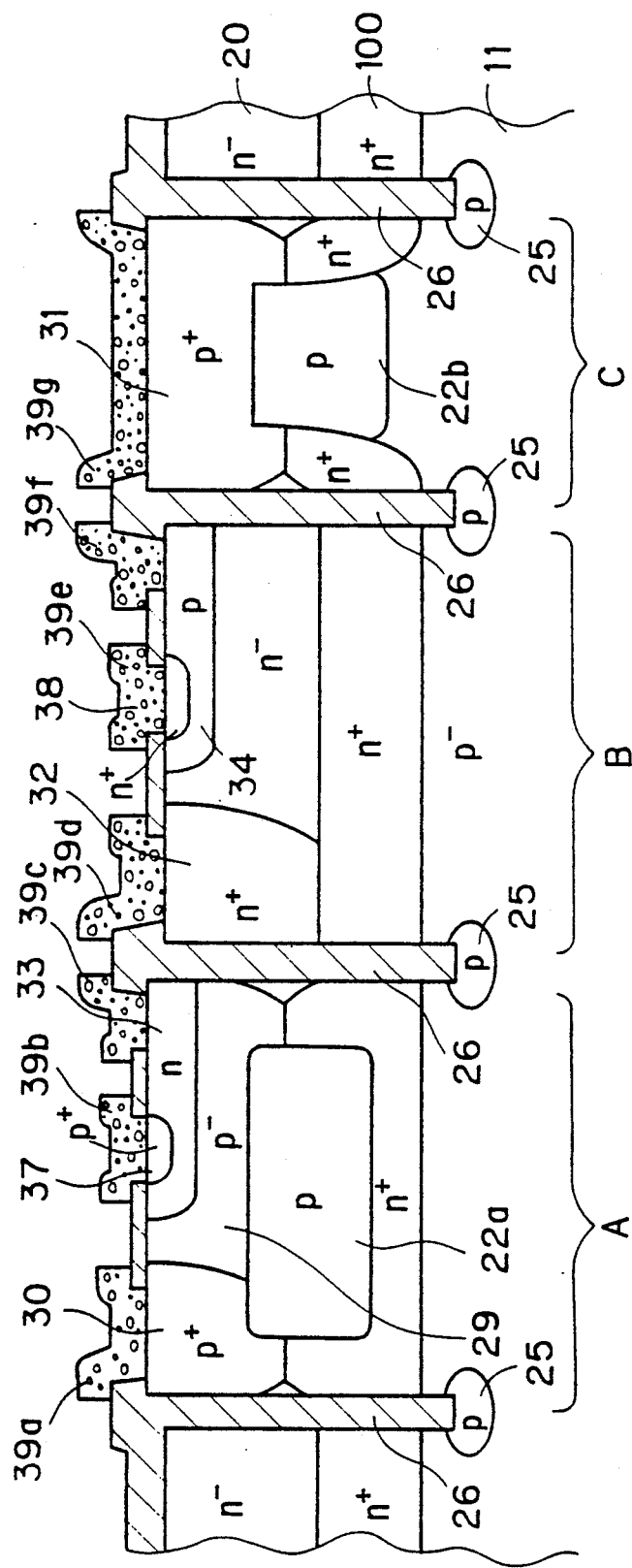

Next, as shown in FIG. 1J, a p$^-$ type collector diffusion layer 29 is formed in the n$^-$ type epitaxial layer 20 of the element region A. Subsequently a p+ type collector extraction layer 30 and a p+ type substrate potential extraction layer 31 are simultaneously formed in the p$^-$ type collector diffusion layer 29 and in the n$^-$ type epitaxial layer 20 of the substrate potential extraction region C, respectively. An n+ type collector extraction layer 32 is formed in the n$^-$ type epitaxial layer 20 of the element region B. The formation of the layer 32 may be prior to the formations of the layers 20–31. The layer 29 may be $1\times10^{16}$–$2\times10^{16}$ cm$^{-3}$ and the layers 30–32 may be $1\times10^{19}$–$3\times10^{19}$ cm$^{-3}$ in impurity concentration. An n-type base diffusion layer 33 is formed on the surface of the p$^-$ type collector diffusion layer 29 of the element region A, and a p-type base diffusion layer 34 is formed on the surface of the n$^-$ type epitaxial layer (or the n$^-$ type collector layer) 20 of the element region B. Either layer 33 or 34 may be formed first. The layer 33 may be 0.2–0.5 μm in thickness and $5\times10^{16}$–$5\times10^{17}$ cm$^{-3}$ in impurity concentration, and the layer 34 may be $0.05 \geqq 0.15$ μm in thickness and $10^{17}$–$10^{18}$ cm$^{-3}$ in impurity concentration.

As shown in FIG. 1K, the thermal oxide films 28 are removed and instead an oxide film 36 having an emitter opening 35 is formed on the top surface. Through the opening 35 are introduced p-type impurities such as boron (B+) to form a p+ type emitter diffusion layer 37 on the surface of the n-type base diffusion layer 33. Through the same procedure, n-type impurities such as arsenic (As+) are introduced selectively to the surface of the p-type base diffusion layer 34 to form an n+ type emitter diffusion layer 38. The layer 37 may be 0.1–0.4 μm in thickness and $1\times10^{20}$–$5\times10^{20}$ cm$^{-3}$ in impurity concentration, and the layer 38 may be 0.05–0.1 μm in thickness and $1\times10^{20}$–$3\times10^{20}$ cm$^{-3}$ in impurity concentration. Thus, the pnp and npn transistors are formed in the element regions A and B, respectively.

The oxide film 36 is removed but a part thereof left. Through openings formed by the removal are formed wirings and electrodes 39a–39g which contact to the respective layers. The electrodes 39a–39c are collector, emitter and base electrodes of the pnp transistor, respectively. The electrodes 39d–39f are collector, emitter and base electrodes of the npn transistor, respectively. The electrode 39g is a substrate potential extraction electrode. Thus, the npn and pnp transistor mixed type semiconductor device comprising the buried layer 22a with sufficient thickness and impurity concentration is accomplished.

Figure 2:
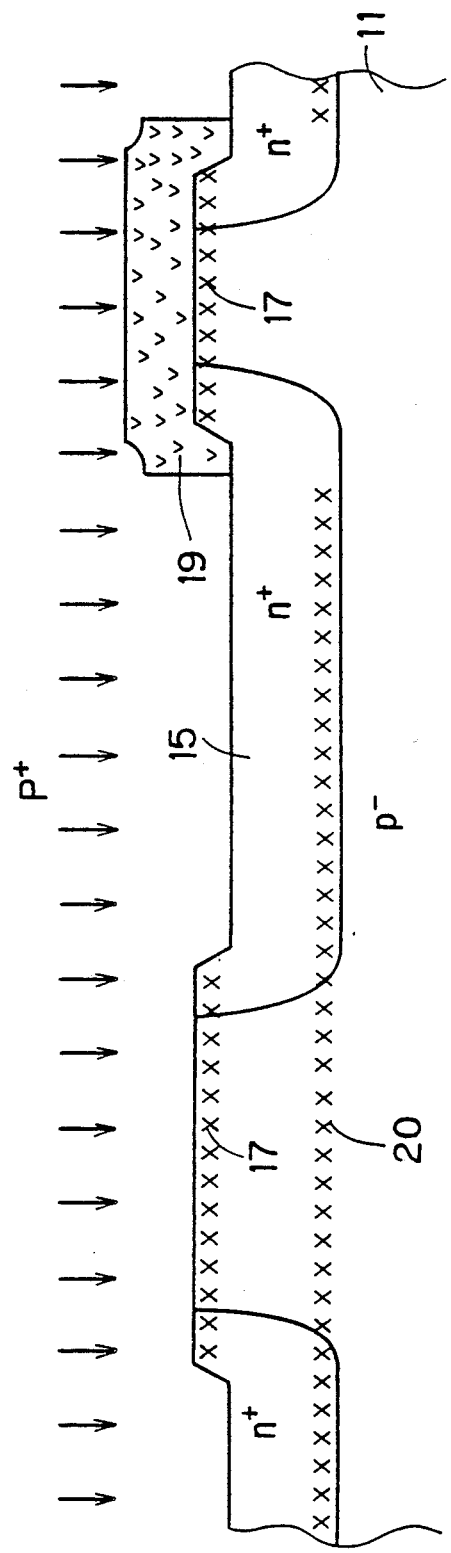
FIG. 2 is a cross-sectional view showing another embodiment of the method for manufacturing the semiconductor device according to the present invention.

FIG. 2 is a cross-sectional view showing another preferred embodiment of the method for manufacturing the semiconductor device according to the present invention. The process of FIG. 2 follows that of FIG. 1C. That is, after the process of FIG. 1C, the oxide films 12 and 16 are removed and instead the region in which the p-type diffusion layer 18b is to be formed later is coated with the thick photoresist 19. In the same manner as the process of FIG. 1E, the n-type impurities 20 such as phosphorus (P+) are implanted at an energy of about 2

Mev. The impurities 17 and 20 are activated and diffused by heat treatment so that the structure shown in FIG. 1F is obtained. Then, the photoresist 19 is removed. Other manufacturing processes are similar to the preferred embodiment of FIGS. 1A–1L. The preferred embodiment of FIG. 2 has an advantage that the process of FIG. 1D can be omitted.

Figure 3A:
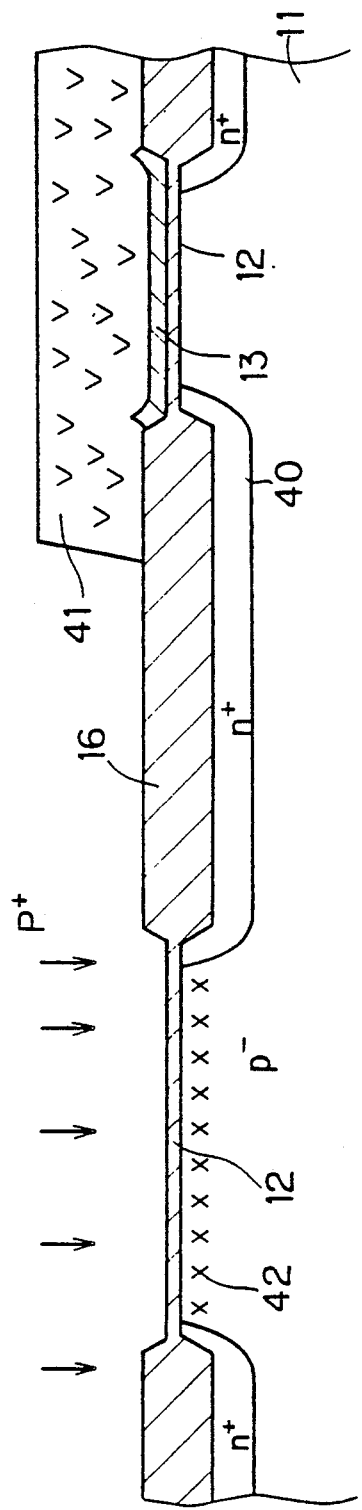

FIGS. 3A–3D are cross-sectional views showing still another preferred embodiment of the method for manufacturing the semiconductor device according to the present invention. After the process of FIG. 1A, the oxide films 16 and n+ type diffusion layers 40 are formed by heat treatment as shown in FIG. 3A. The degree of diffusion of the n+ type diffusion layers 40 is controlled to be less than that of the n+ type diffusion layers 15 of FIG. 1B. The region in which the p-type diffusion layer 18b is to be formed later is coated with photoresist 41, and after the nitride film 13 in the region in which the p-type diffusion layer 18a is to be formed later is removed, n-type impurities 42 such as phosphorus (P+) are injected at low concentration.

Figure 3B:
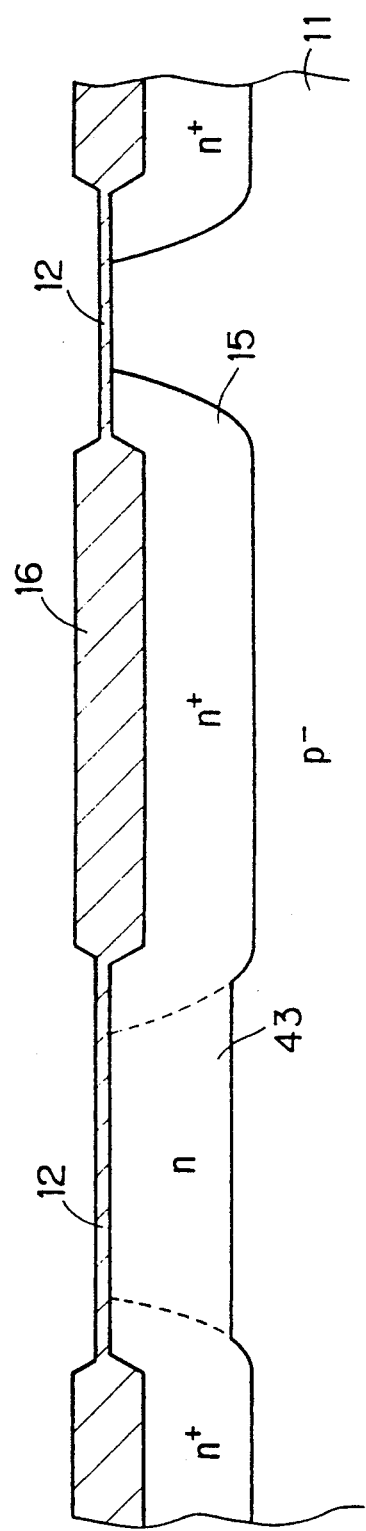

Thereafter, the nitride film 13 and the photoresist 41 are removed. By heat treatment, the injected n-type impurities 42 are activated and diffused and the n+ type diffusion layers 40 are re-diffused. Thus, the n+ type diffusion layers 15 with high impurity concentration and the n-type diffusion layer 43 with low impurity concentration are formed as shown in FIG. 3B.

Next, as shown in FIG. 3C, masked with the oxide films 16, the p-type impurities 17 such as boron (B+) are injected. This process is similar to the process of FIG. 1C. The injected p-type impurities 17 are activated and diffused by heat treatment, thereby being formed the p-type diffusion layers 18a and 18b as shown in FIG. 3D. The n-type diffusion layer 43 that is left at this time becomes the n-type diffusion layer 21 which is similar to that of FIG. 1F. Thereafter, the oxide films 12 and 16 are removed, thereby the same structure as FIG. 1F being obtained. The following processes are similar to the preferred embodiment of FIGS. 1A–1L.

Figure 4A:
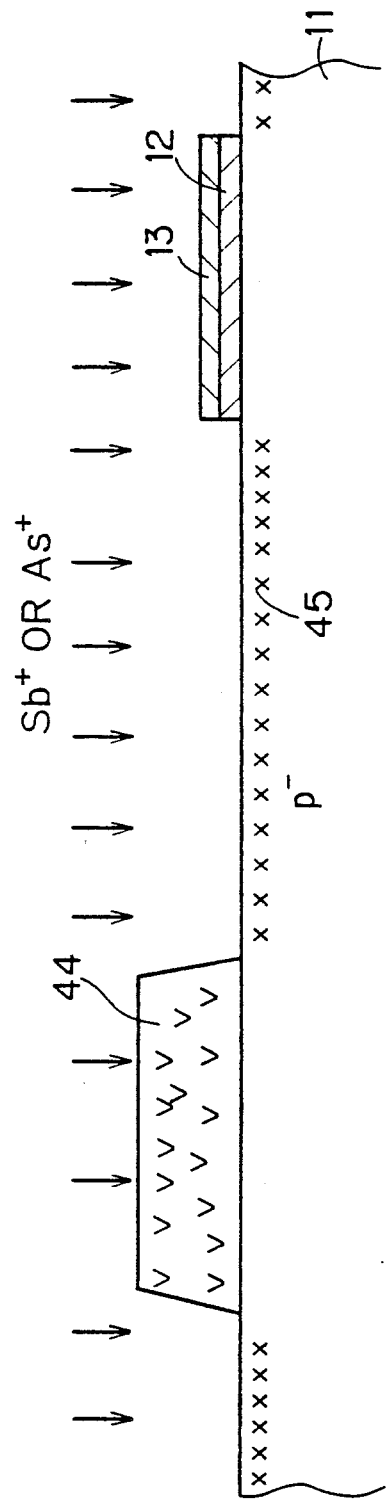

FIGS. 4A–4E are cross-sectional views showing still another preferred embodiment of the method for manufacturing the semiconductor device according to the present invention. First, as shown in FIG. 4A, the oxide film 12 and the nitride film 13 are formed only in the region in which the p-type diffusion region 18b is to be formed later, and photoresist 44 is formed only in the region in which the p-type diffusion region 18a is to be formed later. N-type impurities 45 such as antimony (Sb+) or arsenic (As+) are injected at high concentration into the p− type silicon substrate 11.

Figure 4B:
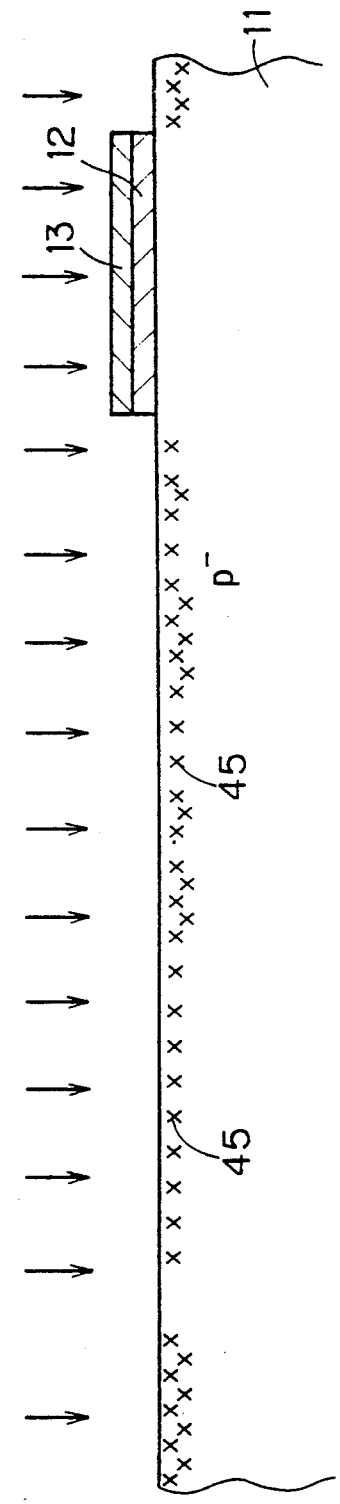
Figure 4C:
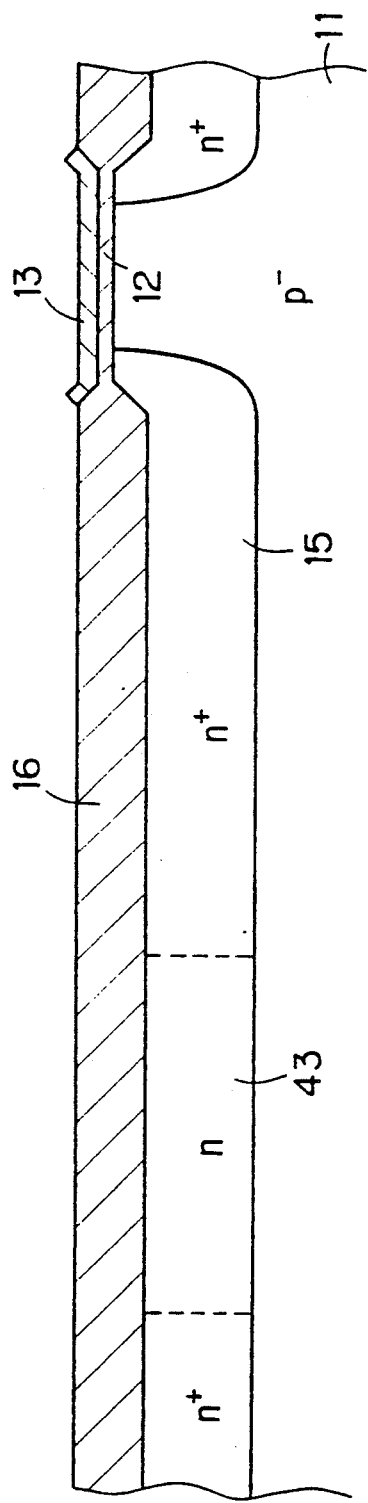

After the photoresist 44 is removed, as shown in FIG. 4B, the n-type impurities 45 are again injected at low concentration into the p− type silicon substrate 11. Thereafter, the injected n-type impurities 45 are activated and diffused by heat treatment, and the top surface is thermally oxidized. Accordingly, the high concentrated n+ type diffusion layers 15, the low concentrated n-type diffusion layer 43 and the oxide films 16 are formed as shown in FIG. 4C.

Figure 4D:
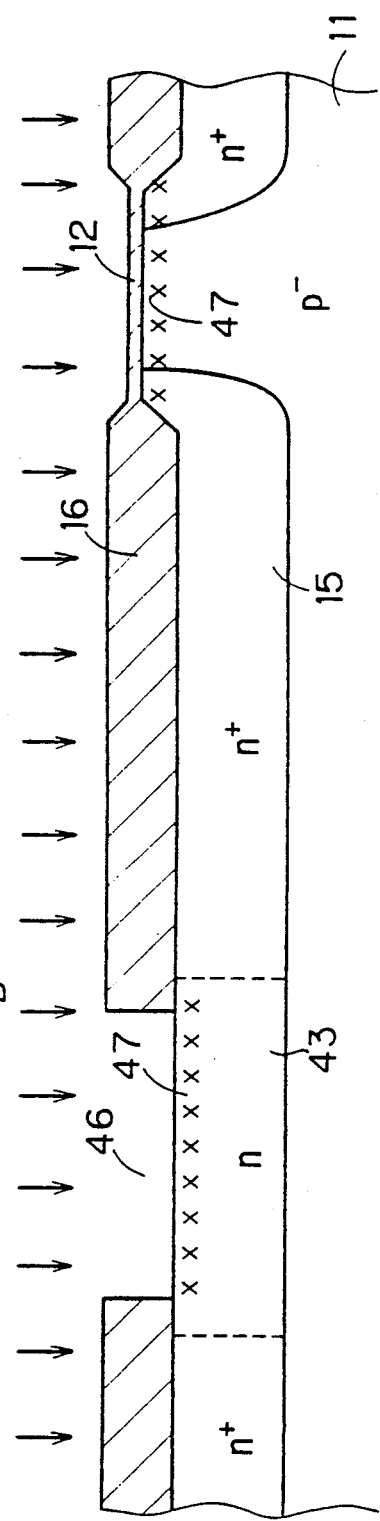
Figure 4E:
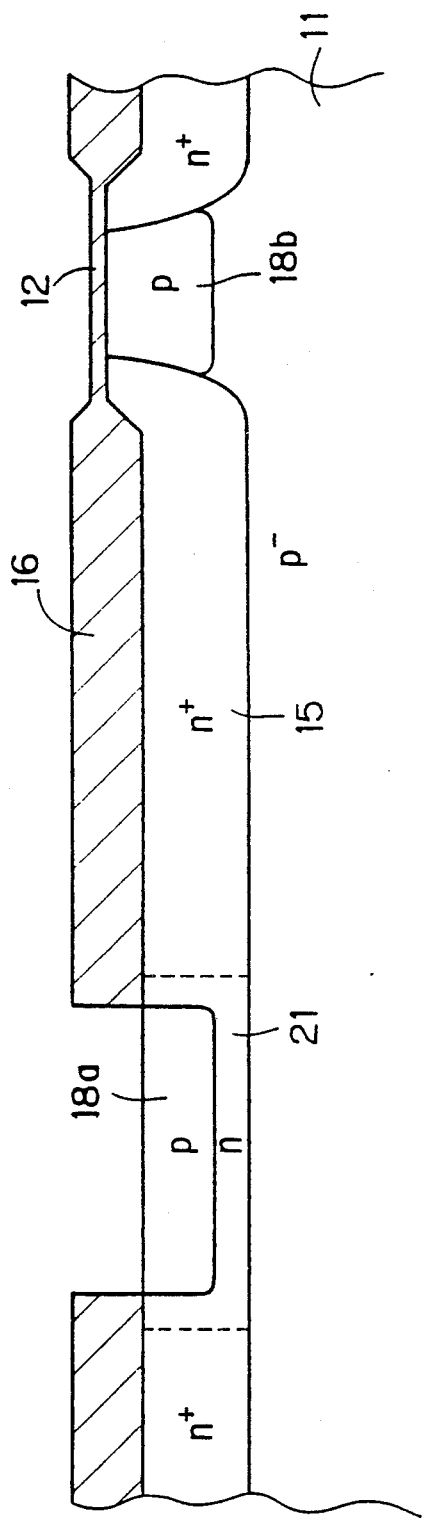
Figure 5A:
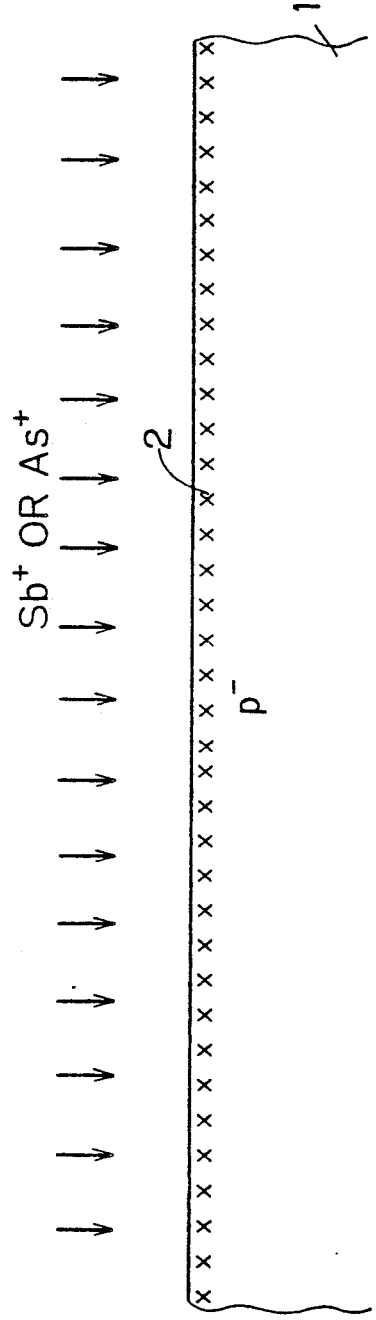
FIGS. 5A-5F are cross-sectional views showing a conventional method for manufacturing a semiconductor device.
Figure 5B:
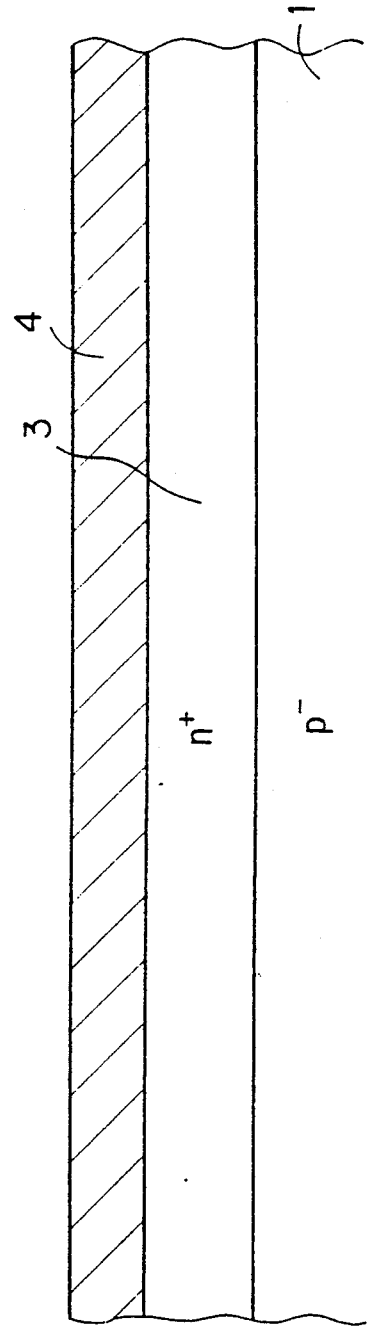
Figure 5C:
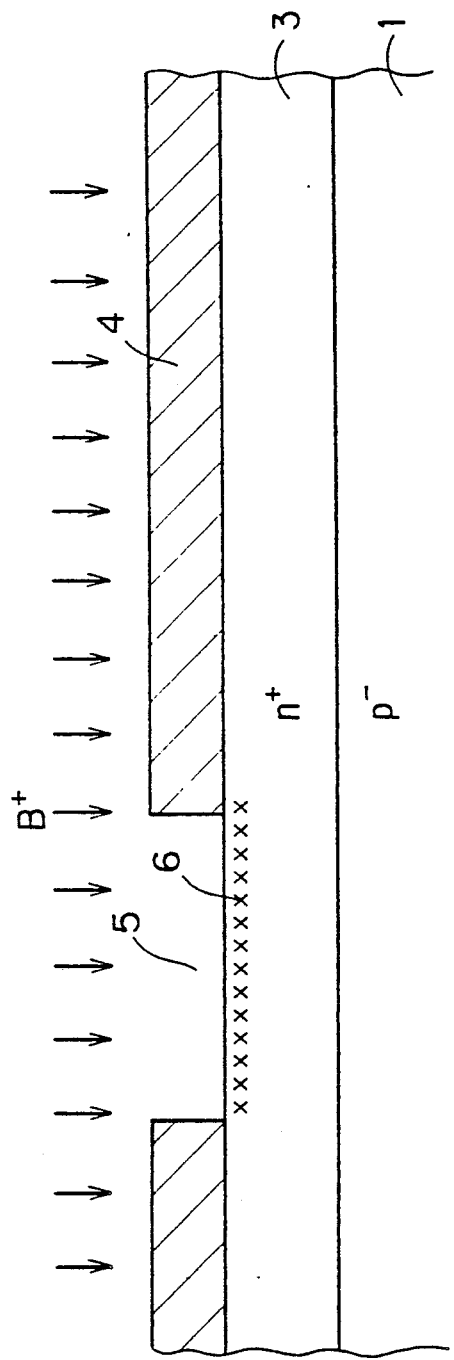
Figure 5D:
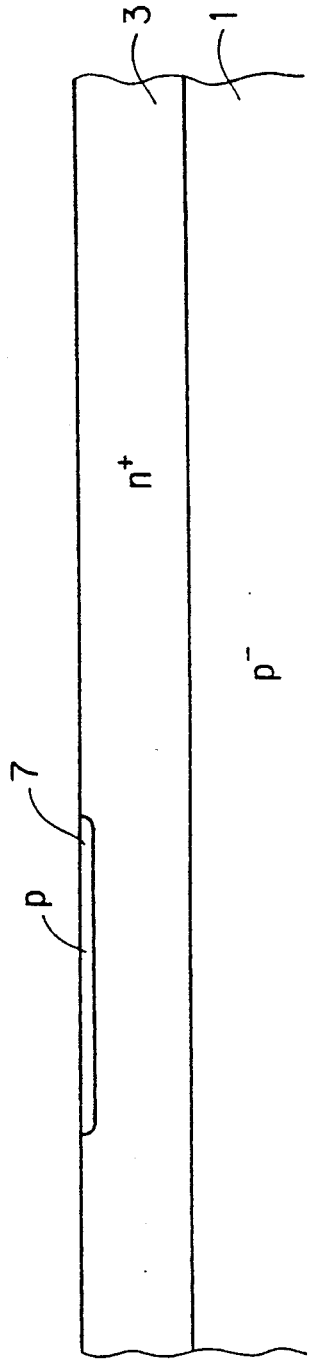
Figure 5E:
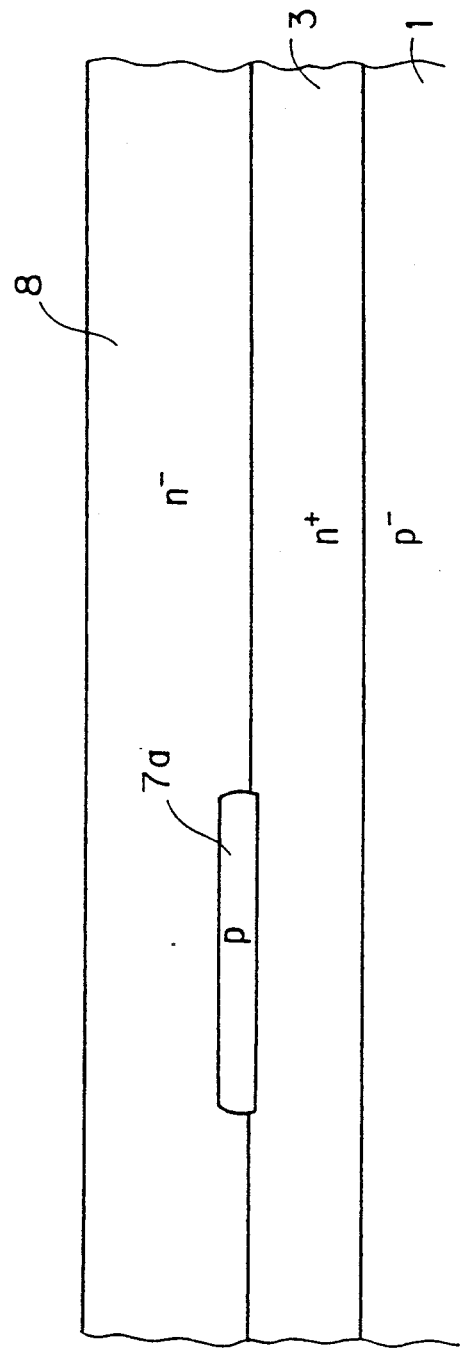
Figure 5F:
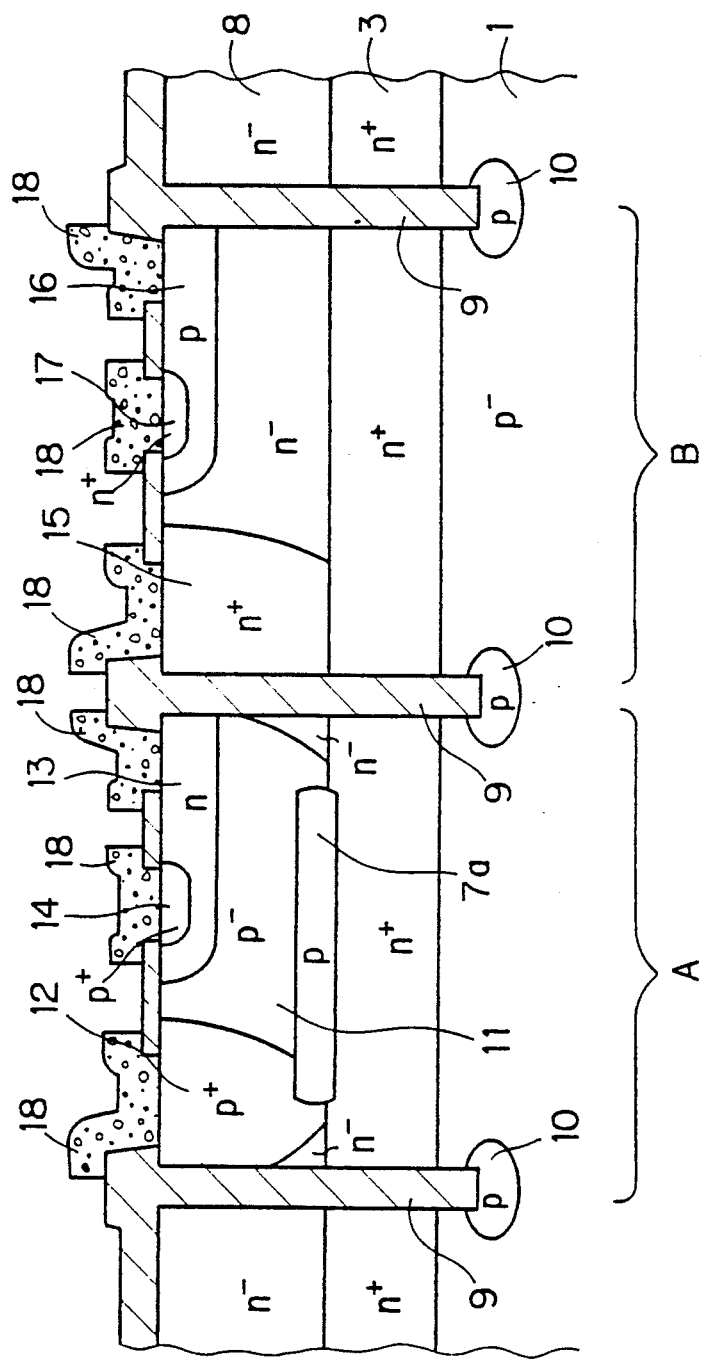

Next, as show in FIG. 4D, the nitride film 13 is removed, and an opening 46 is formed in the oxide films 16 of the region in which the p-type diffusion layer 18a is to be formed later. Masked with the oxide films 16, p-type impurities 47 such as boron (B+) are injected. Thereafter, the injected p-type impurities 47 are activated and diffused by heat treatment so that the p-type diffusion regions 18a and 18b are formed as shown in FIG. 4E. The n-type diffusion layer 43 that is left at this time becomes the n-type diffusion layer 21 similar to that of FIG. 1F. The oxide films 12 and 16 are removed, so that the same structure as FIG. 1F is obtained. The following processes are similar to the preferred embodiment of FIGS. 1A–1F.

In the respective above-mentioned preferred embodiments, explained is the application of the present invention to the manufacture of the npn and pnp transistor mixed type semiconductor device. The present invention, however, is applicable to the general cases of providing the semiconductor device with a sufficiently thick buried layer with high impurity concentration.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A method for manufacturing a semiconductor device, comprising the steps of:
    (a) preparing a first conductivity type semiconductor substrate with relatively low impurity concentration;
    (b) forming second conductivity type first and second semiconductor regions with relatively high impurity concentration on the surface of said semiconductor substrate and a first conductivity type third semiconductor region with relatively high impurity concentration on the surface of said semiconductor substrate sandwiched between said first and second semiconductor regions;
    (c) implanting second conductivity type impurities at a range of reaching an interface of said third semiconductor region and said semiconductor substrate so as to extend over said first and second semiconductor regions;
    (d) diffusing said impurities to form a second conductivity type fourth semiconductor region connected to said first and second semiconductor regions between said third semiconductor region and said semiconductor substrate; and
    (e) forming a first conductivity type buried layer by depositing a second conductivity type semiconductor layer with relatively low impurity concentration on an entire top surface to bury said third semiconductor region.

2. A method for manufacturing a semiconductor device in accordance with claim 1, wherein
    said step (b) comprises the steps of:
    selectively implanting and diffusing second conductivity type impurities in the surface of said semiconductor substate to form said first and second semiconductor regions; and
    selectively implanting and diffusing first conductivity type impurities in the surface of said semiconductor substrate to form said third semiconductor region.

3. A method for manufacturing a semiconductor device in accordance with claim 1, further comprising the steps of:
    forming trenches which reach said semiconductor substrate from a surface of said semiconductor layer in boundary portions between said first and third semiconductor regions and between said third and second semiconductor regions and filling up said trenches with insulating material to form separated element region between said trenches; and forming a semiconductor element in said separated element region.

4. A method for manufacturing a semiconductor device in accordance with claim 3, wherein
said first and second conductivity types are p and n types, respectively, and
said semiconductor element includes a pnp transistor.

5. A method for manufacturing a semiconductor device, comprising the steps of:
  (a) preparing a first conductivity type semiconductor substrate with relatively low impurity concentration;
  (b) forming second conductivity type first and second semiconductor regions with relatively high impurity concentration on a surface of said semiconductor substrate;
  (c) implanting first conductivity type first impurities on the surface of said semiconductor substrate sandwiched between said first and second semiconductor regions and second conductivity type second impurities at a range deeper than said first impurities so as to extend over said first and second semiconductor regions;
  (d) diffusing said first and second impurities to form a first conductivity type third semiconductor region with relatively high impurity concentration on the surface of said semiconductor substrate sandwiched between said first and second semiconductor regions and a second conductivity type fourth semiconductor region connected to said first and second semiconductor regions between said third semiconductor region and said semiconductor substrate; and
  (e) forming a first conductivity type buried layer by depositing a second conductivity type semiconductor layer with relatively low impurity concentration on an entire top surface to bury said third semiconductor region.

6. A method for manufacturing a semiconductor device in accordance with claim 5, wherein
said step (b) includes the step of selectively implanting and diffusing second conductivity type impurities in the surfce of said semiconductor substrate.

7. A method for manufacturing a semiconductor device in accordance with claim 5, further comprising the steps of:
  forming trenches which reach said semiconductor substrate from a surface of said semiconductor layer in boundary portions between said first and third semiconductor regions and between said third and second semiconductor regions and filling up said trenches with insulating material to form separated element region between said trenches; and
  forming a semiconductor element in said separated element region.

8. A method for manufacturing a semiconductor device in accordance with claim 7, wherein
said first and second conductivity types are p and n types, respectively, and
said semiconductor element includes a pnp transistor.

9. A method for manufacturing a semiconductor device, comprising the steps of:
  (a) preparing a first conductivity type semiconductor substrate with relatively low impurity concentration;
  (b) forming second conductivity type first and second semiconductor regions with relatively high impurity concentration on a surface of said semiconductor substrate and a second conductivity type third semiconductor region with relatively low impurity concentration on the surface of said semiconductor substrate sandwiched between said first and second semiconductor regions.
  (c) forming a first conductivity type fourth semiconductor region with relatively high impurity concentration on a surface of said third semiconductor region; and
  (d) forming a first conductivity type buried layer by depositing a second conductivity type semiconductor layer with relatively low impurity concentration on an entire top surface to bury said fourth semiconductor region.

10. A method for manufacturing a semiconductor device in accordance with claim 9, wherein
said step (b) comprises the steps of:
  selectively implanting and diffusing second conductivity type impurities in the surface of said semiconductor substrate to form said first and second semiconductor regions; and
  selectively implanting and diffusing second conductivity type impurities in the surface of said semiconductor substrate to form said third semiconductor region.

11. A method for manufacturing a semiconductor device in accordance with claim 9, wherein
said step (b) comprises the steps of:
  selectively implanting second conductivity type impurites for said first and second semiconductor regions in the surface of said semiconductor substate;
  selectively implanting second conductivity type impurities for said first, second and third semiconductor regions in the surface of said semiconductor substrate; and
  diffusing said second conductivity type impurities to simultaneously form said first, second and third semiconductor regions.

12. A method for manufacturing a semiconductor device in accordance with claim 9, wherein
said step (c) includes the step of implanting and diffusing first conductivity type impurities in the surface of said third semiconductor region.

13. A method for manufacturing a semiconductor device in accordance with claim 9, further comprising the steps of:
  forming trenches which reach said semiconductor substrate from a surface of said semiconductor layer in boundary portions between said first and third semiconductor regions and between said third and second semiconductor regions and filling up said trenches with insulating material to form separated element region between said trenches; and
  forming a semiconductor element in said separated element region.

14. A method for manufacturing a semiconductor device in accordance with claim 9, wherein
said first and second conductivity types are p and n types, respectively, and
said semiconductor element includes a pnp transistor.

15. A method for manufacturing a semiconductor device, comprising the steps of:

(a) preparing a first conductivity type semiconductor substrate with relatively low impurity concentration.,
(b) forming second conductivity type first, second and third semiconductor regions with relatively high impurity concentration on a surface of said semiconductor substrate, a first conductivity type fourth semiconductor region with relatively high impurity concentration on the surface of said semiconductor substrate sandwiched between said first and second semiconductor regions and a first conductivity type fifth semiconductor region with relatively high impurity concentration on the surface of said semiconductor substrate sandwiched between said second and third semiconductor regions;
(c) implanting second conductivity type impurities at a range of reaching an interface of said fourth semiconductor region and said semiconductor substrate so as to extend over said first and second semiconductor regions;
(d) diffusing said impurities to form a second conductivity type sixth semiconductor region connected to said first and second semiconductor regions between said fourth semiconductor region and said semiconductor substrate;
(e) forming first conductivity type first and second buried layers by depositing a second conductivity type semiconductor layer with relatively low impurity concentration on an entire top surface to bury said fourth and fifth semiconductor regions;
(f) forming trenches which reach said semiconductor substrate from a surface of said semiconductor layer in boundary portions between said first and fourth semiconductor regions, between said fourth and second semiconductor regions, between said second and fifth semiconductor regions and between said fifth and third semiconductor regions, respectively, and filling up said trenches with insulating material to separate said semiconductor layer into sixth through tenth semiconductor regions corresponding to said first through fifth semiconductor regions, respectively; and
(g) forming first and second semiconductor elements in said seventh and ninth semiconductor regions, respectively, and a first conductivity type eleventh semiconductor region which reaches said fifth semiconductor region from a surface of said tenth semiconductor region in said tenth semiconductor region, and a substrate potential extraction electrode on said eleventh semiconductor region.

16. A method for manufacturing a semiconductor device in accordance with claim 15, wherein
said step (b) comprises the steps of:
selectively implanting and diffusing second conductivity type impurities in the surface of said semiconductor substrate to form said first, second and third semiconductor regions; and
selectively implanting and diffusing first conductivity type impurities in the surface of said semiconductor substate to form said fourth and fifth semiconductor regions.

17. A method for manufacturing a semiconductor device in accordance with claim 15, wherein
said first and conductivity types are p and n types, respectively, and
said first and second semiconductor elements includes pnp and npn transistors, respectively.

* * * * *